United States Patent
Hughes et al.

(10) Patent No.: US 11,044,141 B2
(45) Date of Patent: Jun. 22, 2021

(54) HIGH DENSITY, HIGH AVAILABILITY COMPUTE SYSTEM

(71) Applicants: Phillip N Hughes, Los Gatos, CA (US); Robert J Lipp, Los Gatos, CA (US)

(72) Inventors: Phillip N Hughes, Los Gatos, CA (US); Robert J Lipp, Los Gatos, CA (US)

(*) Notice: Subject to any disclaimer, the term of this patent is extended or adjusted under 35 U.S.C. 154(b) by 0 days.

(21) Appl. No.: 16/506,908

(22) Filed: Jul. 9, 2019

(65) Prior Publication Data

US 2021/0014105 A1    Jan. 14, 2021

(51) Int. Cl.
| | |
|---|---|
| *H04L 12/24* | (2006.01) |
| *H04L 12/931* | (2013.01) |
| *H04L 12/707* | (2013.01) |
| *H05K 7/20* | (2006.01) |
| *H04L 12/863* | (2013.01) |
| *G06F 1/20* | (2006.01) |

(52) U.S. Cl.
CPC .......... *H04L 41/0668* (2013.01); *G06F 1/20* (2013.01); *H04L 41/0659* (2013.01); *H04L 41/0816* (2013.01); *H04L 45/24* (2013.01); *H04L 47/624* (2013.01); *H04L 49/405* (2013.01); *H05K 7/20236* (2013.01); *H05K 7/20272* (2013.01)

(58) Field of Classification Search
CPC .......... H04L 41/0668; H04L 41/0659; H04L 41/0816; H04L 45/24; H04L 47/624; H04L 49/405; G06F 1/20
See application file for complete search history.

(56) References Cited

U.S. PATENT DOCUMENTS

| | | | |
|---|---|---|---|
| 4,356,546 A | 10/1982 | Whiteside et al. | |
| 5,099,485 A * | 3/1992 | Bruckert | G06F 11/0724 714/11 |
| 5,588,152 A * | 12/1996 | Dapp | G06F 7/483 712/16 |
| 5,720,024 A | 2/1998 | Shito et al. | |
| 5,794,059 A * | 8/1998 | Barker | G06F 9/30036 712/1 |
| 6,088,727 A | 7/2000 | Hosokawa et al. | |
| 6,418,539 B1 | 7/2002 | Walker | |
| 6,594,261 B1 * | 7/2003 | Boura | H04L 41/0654 370/217 |

(Continued)

OTHER PUBLICATIONS

Gravano, Luis, Pifarre, Gustavo, Berman, Pablo, Sanz, Jorge, Adaptive Dealock- and Livelock-Free Routing with all Minimal Paths in Tous Networks, 1233-1234, (Year: 1994).*

(Continued)

*Primary Examiner* — Ayaz R Sheikh
*Assistant Examiner* — Louis Samara

(57) ABSTRACT

A new physical computer architecture that combines elements in a virtuous cycle to eliminate performance killing inefficiencies in compute systems and need never be physically repaired during its lifetime is described. The system comprises a three dimensional rectangular cube structure with integrated liquid cooling and a multi-dimensional direct network laced through it. The network comprises a distributed, dynamically adaptive, multiply-fault-tolerant routing protocol that can logically replace failed components.

10 Claims, 7 Drawing Sheets

Brick Slice With Cold Rails Attached

(56) References Cited

U.S. PATENT DOCUMENTS

| | | | |
|---|---|---|---|
| 6,981,054 B1* | 12/2005 | Krishna | H04L 47/10 370/236 |
| 7,012,807 B2 | 3/2006 | Chu et al. | |
| 7,146,446 B2 | 12/2006 | Chu | |
| 7,228,441 B2* | 6/2007 | Fung | G06F 1/3209 713/300 |
| 7,312,987 B1 | 12/2007 | Konshak | |
| 7,382,775 B2* | 6/2008 | Hesse | H04L 12/2854 370/386 |
| 7,552,758 B2 | 6/2009 | Garner et al. | |
| 8,000,103 B2* | 8/2011 | Lipp | H05K 7/20818 361/702 |
| 8,132,068 B2* | 3/2012 | Jiang | H04L 1/1832 714/748 |
| 8,150,019 B2 | 4/2012 | Smith | |
| 8,374,092 B2* | 2/2013 | Previdi | H04L 41/0668 370/237 |
| 8,432,692 B2 | 4/2013 | Peng et al. | |
| 8,879,268 B2 | 11/2014 | Lee et al. | |
| 9,128,682 B2* | 9/2015 | Dean | G06F 1/20 |
| 9,634,959 B2* | 4/2017 | Coteus | H05K 7/20318 |
| 9,713,287 B2 | 7/2017 | Wong et al. | |
| 2003/0051860 A1 | 3/2003 | Montgomery et al. | |
| 2005/0152114 A1* | 7/2005 | Fernandez | G06F 1/20 361/699 |
| 2015/0077728 A1* | 3/2015 | Laurent | G03F 7/70891 355/30 |
| 2016/0012004 A1* | 1/2016 | Arimilli | G06F 13/4027 710/306 |

OTHER PUBLICATIONS

Seyyed Javadi, Hamid Haj, An energy aware cellular learning automata based routing algorithm for sensor networks, Oct. 2009, pp. 81-82. IEEE Xplore (Year: 2009).*

Alverson, Robert, Cray High speed Networking, slide #14, (Year: 2012).*

Robert Alverson, Cray High Speed Networking, Hot Interconnects Conference, Aug. 20, 2012, USA.

A. Bhatele, Evaluating Trade-offs in Potential Exascale Interconnect Topologies, Aug. 16, 2018, LLNL-TR-756549, Lawrence Livermore National Laboratory, Livermore, CA USA.

* cited by examiner

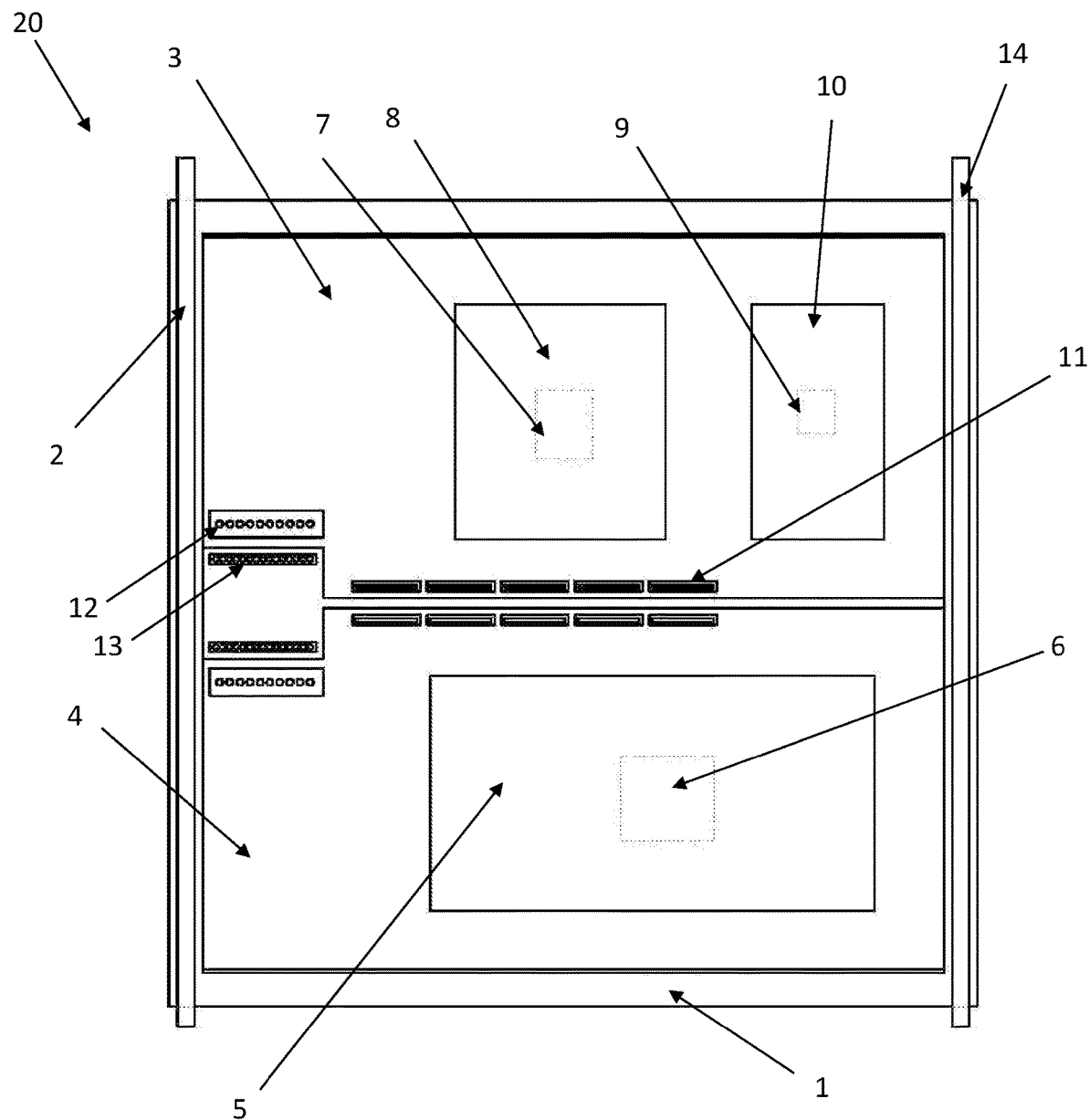
Fig. 1 Open Frame Compute Brick

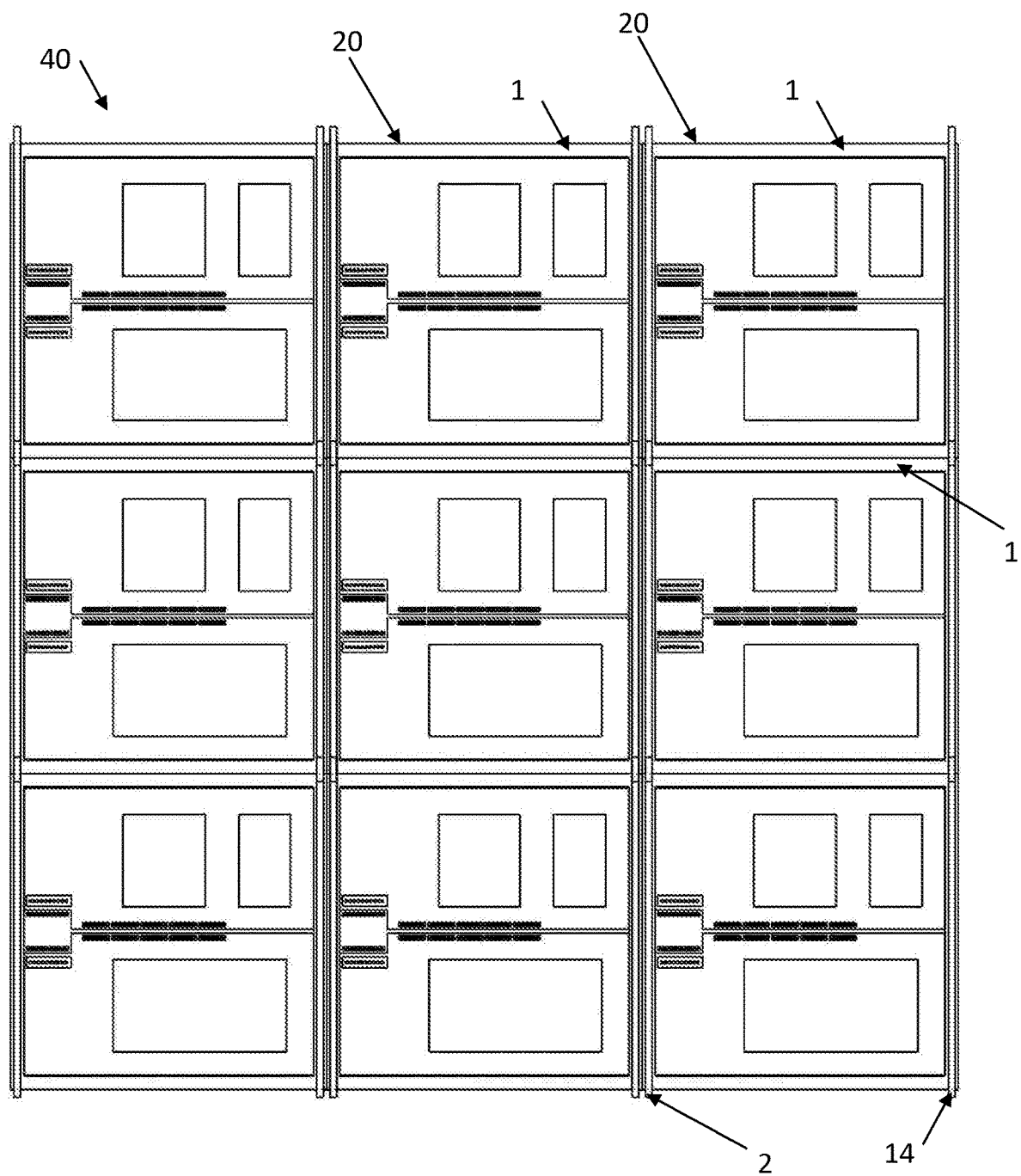
Fig. 2 Compute Brick Slice (2D Array)

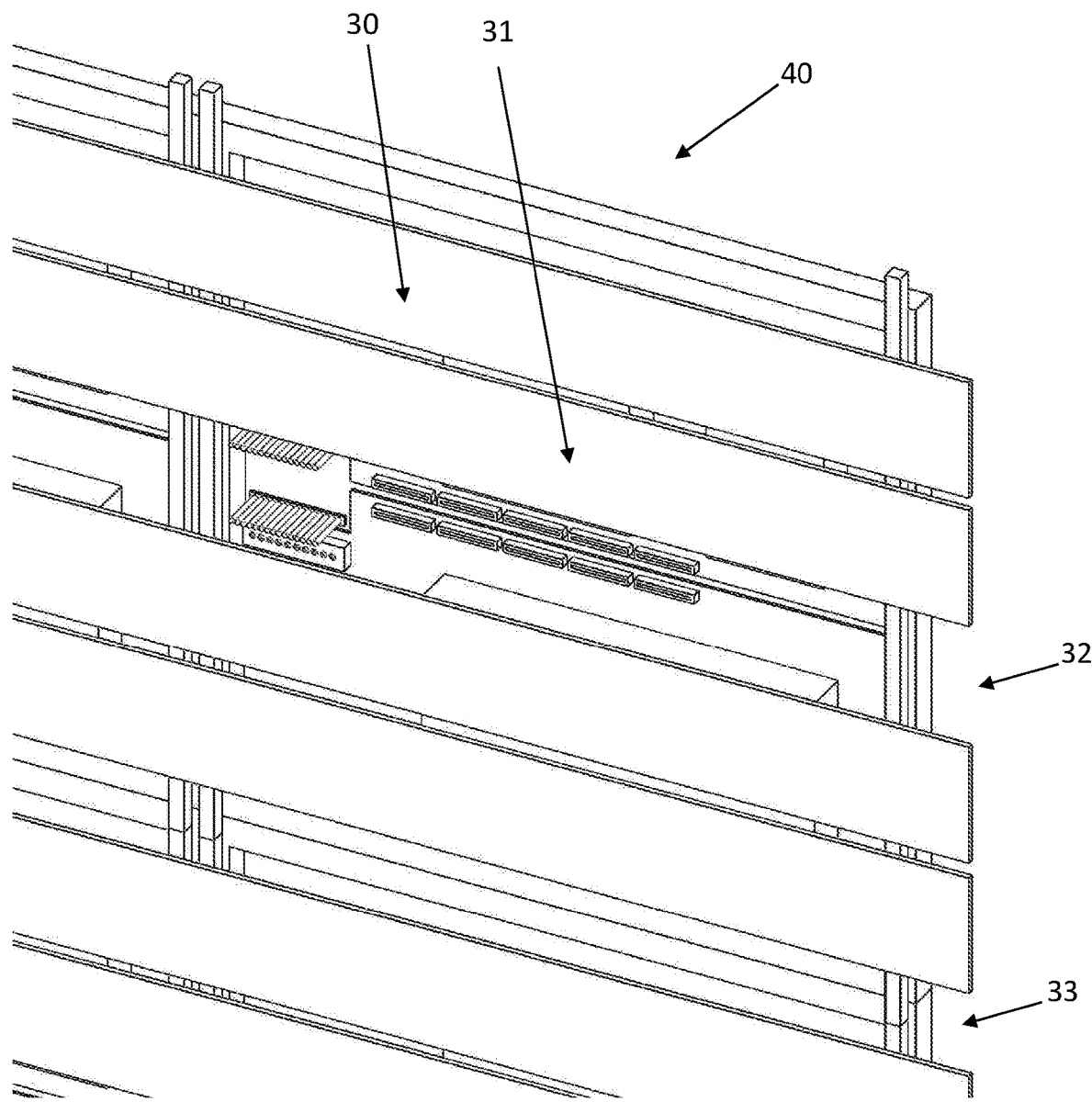
Fig. 3   Brick Slice With Cold Rails Attached

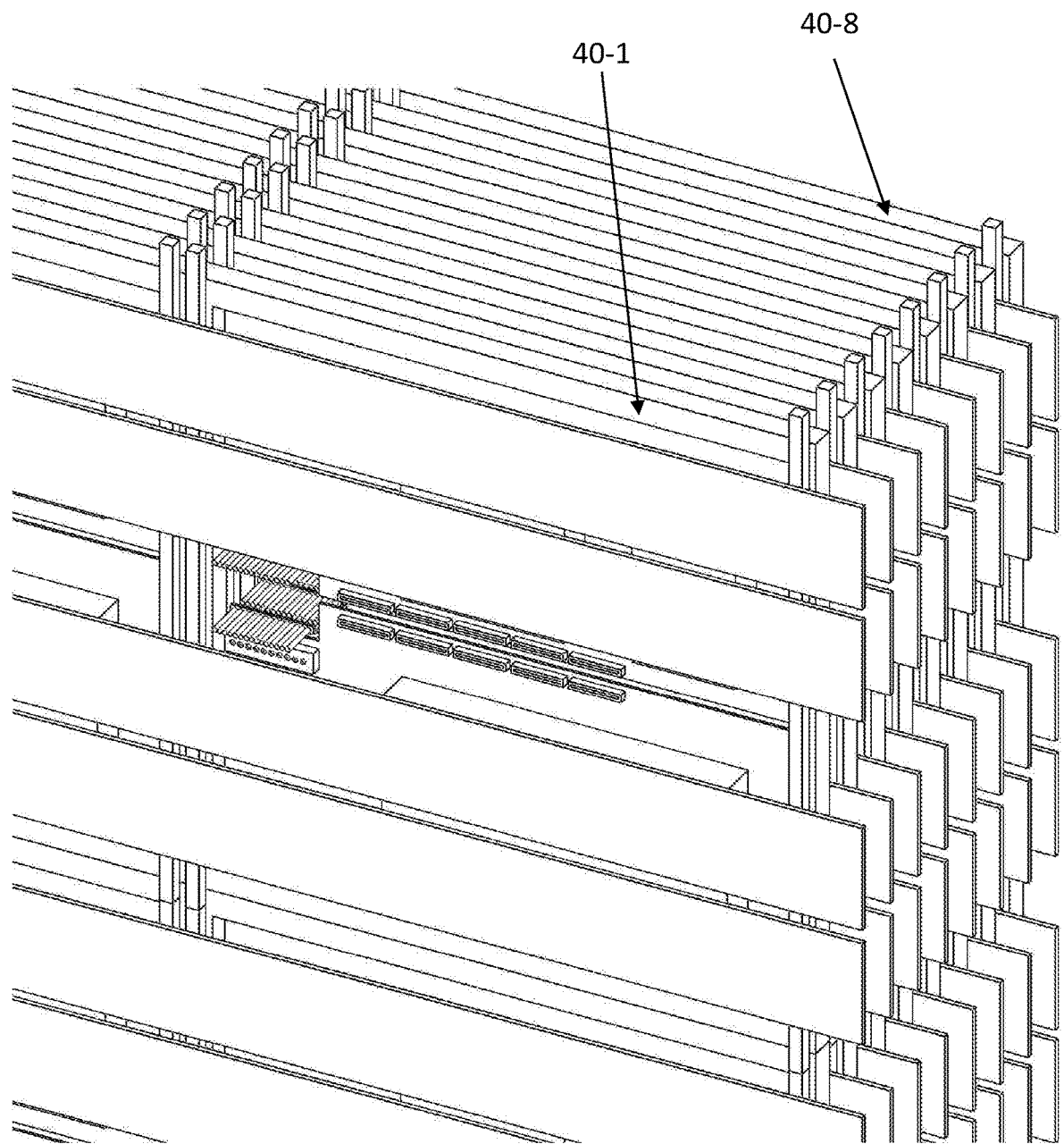
Fig. 4 3D Rectangular Cube Array

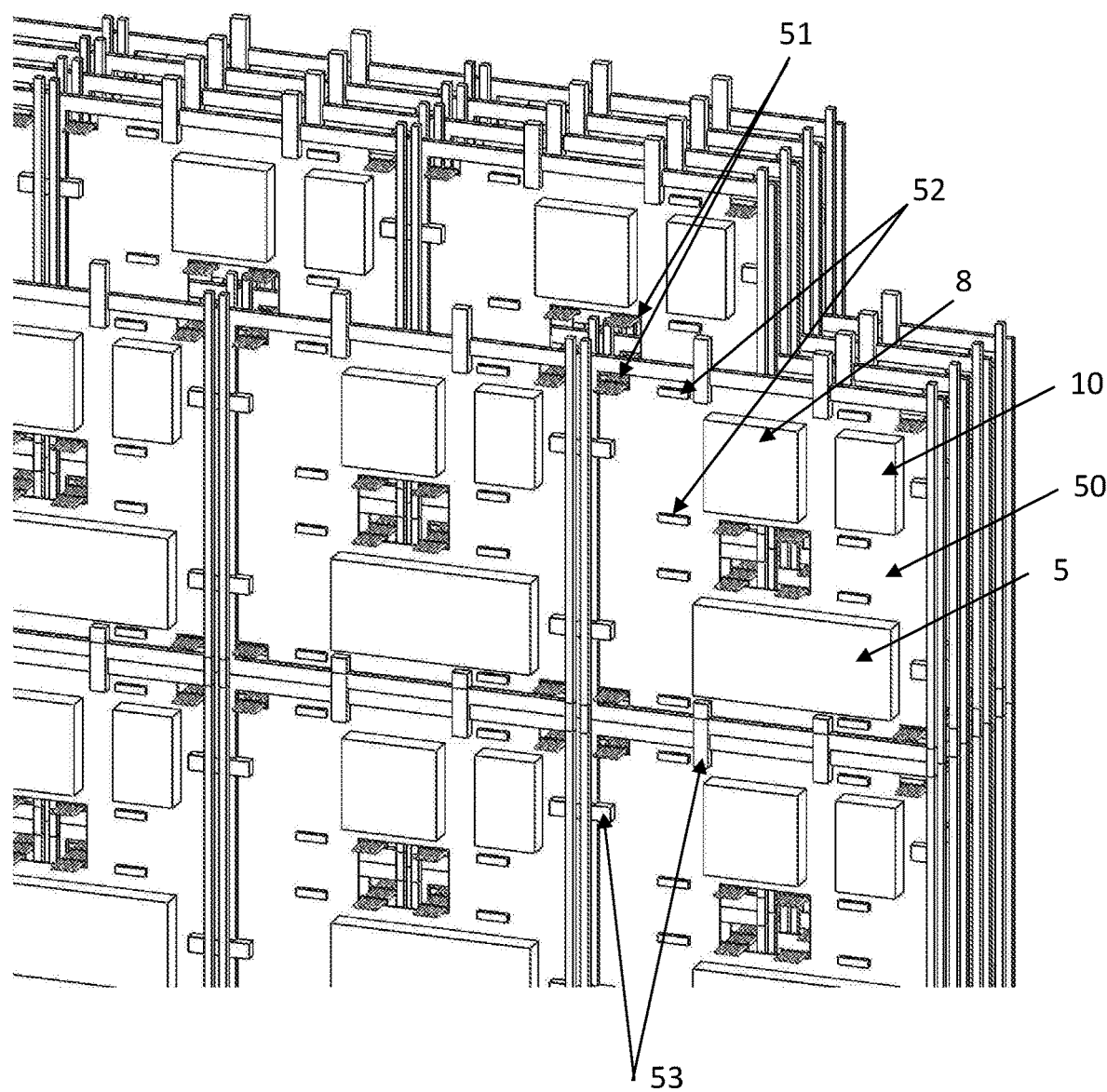
Fig. 5 Interdigitated Array

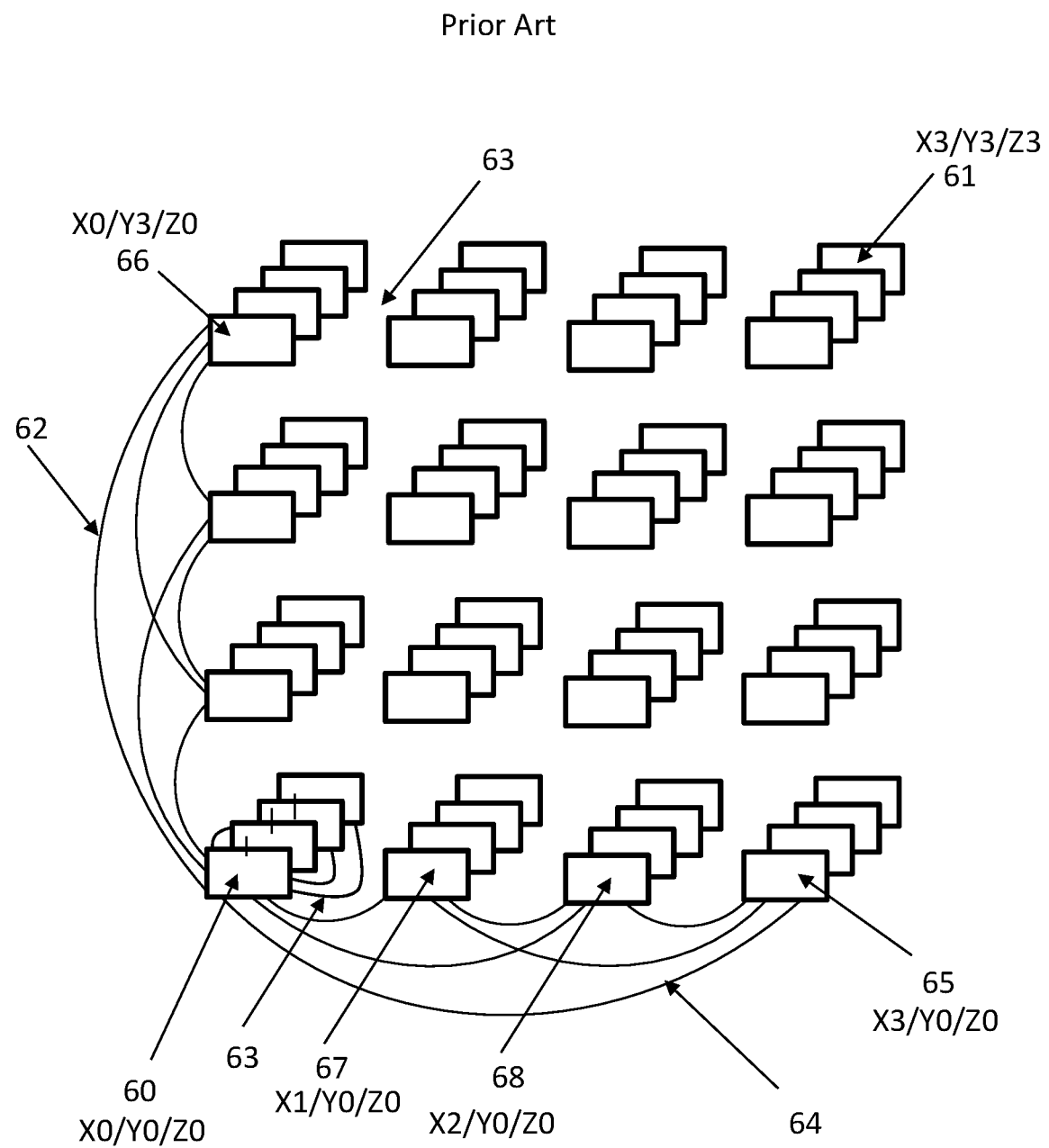
Fig. 6  4x4x4 Array Wiring

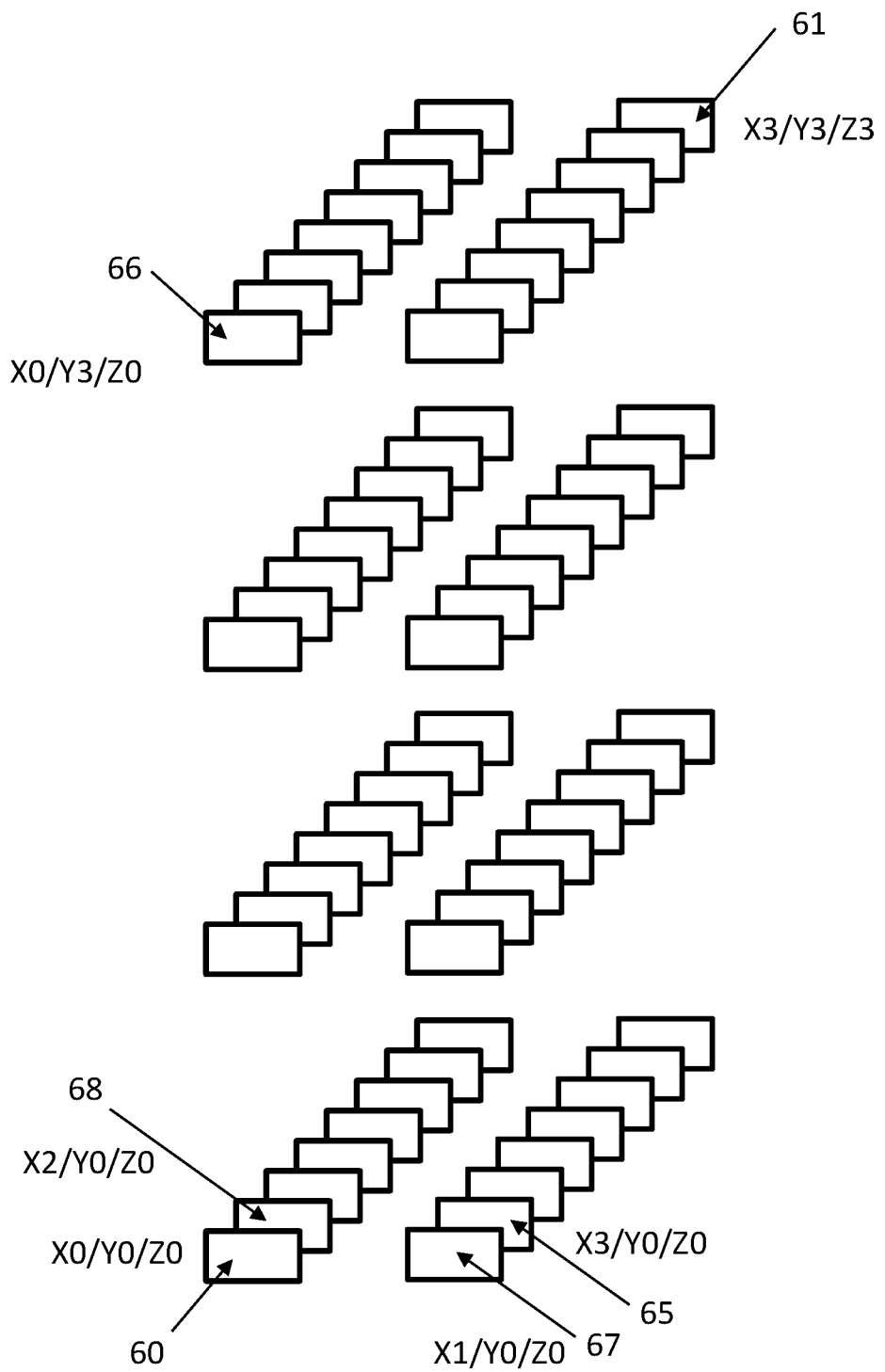
Fig. 7 Folded 64 Node Array

HIGH DENSITY, HIGH AVAILABILITY COMPUTE SYSTEM

CROSS-REFERENCE TO RELATED APPLICATIONS

This application claims priority benefit of U.S. Provisional Application No. 62/711,572 entitled "High Density, High Availability Compute System", filed on 29 Jul. 2018, which is hereby incorporated in its entirety by reference.

BACKGROUND—PRIOR ART

Large compute and storage systems are generally deployed as modular systems clusters comprising standardized form factor electronic enclosure modules (e.g. "servers") mounted in standardized support structures, e.g. 19 inch or 24 inch wide racks with a "1U" vertical slot spacing of 1.75 inches. Such racks are generally configured in rows with aisles between and around these rows. Accounting for floor space used for the racks, aisles and switches, typical areal density is about five dual processor servers per square foot of overall floor space.

The impetus for modular systems is driven by the need to maintain and cool the servers and electronic components within them.

While this deployment method has been used to successfully build large systems, it has inherent drawbacks:
- the area consumed by a system is necessarily much larger than need be to accommodate aisles for access to the equipment and limitation in height for maintenance and repair;
- the distance between servers can therefore be quite large—tens to hundreds of feet apart in large systems—increasing the latency of data transfers between servers and thus negatively impacting performance;
- network interconnections are costly—expensive optical cabling is often required to maintain signal integrity over the relatively long distances the signals must traverse;
- networking speeds are much slower than the CPU, leading to a mismatch in compute and network performance—due to the limits on server input-output (IO) port speeds and use of external switches configured as trees with limited bandwidth and subject to congestion;
- cooling is problematical, whether by air or liquid, due to the inherent nature of the enclosure form factor and component mounting within;
- required maintenance leads to scheduled downtime;
- required maintenance leads to additional failures and unscheduled downtime due to system disturbance and human error;
- fan cooled systems require maintenance, are subject to failure, and vibrate—all reducing system reliability.

These systems have stubbornly remained the same for decades to the detriment of efficiency, performance, reliability and energy consumption. Historically, innovation has been focused almost solely on raw speed and management improvements.

These modular systems have many other shortcomings:

Low Availability and Reliability

HPC systems that fail only once a week are considered acceptable (resulting in about 1.5 nines availability).

While the electronics per se are extremely reliable, the environment they function in can have a major effect in making them fail. Besides air cooling, human intervention, or even presence, can put systems in considerable jeopardy.

Further, many of the failures are single point, that is, one will bring the system down. The recovery processes are often slow, leading to low availability.

Protection and Recovery

The most often used protection for clusters is provided through the use of check points. Every so often the system halts and stores an image of itself. After a system failure, which can be as trivial as a loose connection, the computer typically stops operating until repaired. Either a technician has to repair it and re-start it at the last checkpoint, or management software brings a substitute module on line and resumes operation automatically.

With more significant failures, such as a switch or a management unit failure, human intervention is still essential.

Network Performance

Indirect networks with fat tree topologies are by far the most deployed. Switches in the fat tree are commonly based upon input buffered crossbars. Latency can be dramatically increased by large buffers, as the time the packets are queued in large buffers directly adds to latency and decreased system performance.

Switched networks are determinate. While they might be architecturally simple, they have many drawbacks: efficiency, congestion avoidance and robustness being the top three. They may have satisfied early needs but are now inadequate due to problems with severe congestion and jitter, cabling bottlenecks and higher costs.

Processor clusters running a Linpac task can achieve close to their theoretical maximum as there is little data movement. Where data has to be moved, performance drops dramatically. Processors may spend most of their time idling waiting for data.

Direct networks with mesh topology are rarely attempted as it has proven very difficult to connect a network with multiple dimensions in a single connection plane at the rear of a series of racks. Even so, IBM, Fujitsu and Cray have all developed at least one. All of them comprise buffered crossbars as the switching elements.

Most software network managers are only capable of responding to simple faults such as a broken link, typically by re-configuring the switches to circumvent the point of failure. Open Protocol Architecture (OPA) has taken a further step. The OPA manager analyses the network and defines multiple possible exit ports on each switch allowing avoidance of adjacent congestion or link failure. More distant issues require the network manager intervention. Further "dispersive routing" permits packets destined for the same destination to be dispatched over diverse routes. While this is a useful innovation for minimizing congestion, indirect networks are limited to transfer speed of that of a single link. Large high performance systems therefore require expensive and relatively low reliability optical interconnects.

Today's large clusters are spread out over a large area increasing network latency. For such systems, packets pass through 3 tiers of switches, representing 5 hops, about 500 ns, plus wire delays of the order of loons to 300 ns. This adds 50%-60% to the overall one way MPI latency.

Some authorities have stated that due to network shortcomings, cluster compute efficiency percent can be in single digits.

Cooling

To date, most systems have been air cooled. Air cooling has several drawbacks. Considerable energy is required to drive the various fans, compressors and pumps. And air is unable to cool high power chips efficiently.

Air cooling, or lack of it, is a major cause of failures. Not only do the server fans produce noise and vibration, but they also circulate dust, ionized particles and other unsavory (to electronics) elements through the system. Further, inadequate cooling shortens component lifetimes as can the rapid thermal cycling due to the low thermal mass of typical of air cooled systems.

Optical transducers are particularly susceptible to temperature, both from reliability and error rate aspects. Cooling them with air is a tricky proposition.

Warm water cooling is starting to be gradually adopted, typically by indirect cooling such as the addition of rear cooling doors. In a few cases the liquid is brought directly to the hottest, e.g. processor chips, with the balance of the components forced air cooled by fans. There are also several more exotic techniques, such as immersion cooling, but they are not main stream. While liquid is an energy saving and cooling improvement, it is generally applied only to the hottest chips.

Large compute systems that bring cooling liquid to the chips require "quick connects" between the liquid distribution manifold and modules. This allows them to be removed for servicing. There have been reports of leakage from the quick connects and from the cooling units attached to the chips.

Users of plastic plumbing have also experienced perishing and leaking problems with their tubing. The alternative copper tubing is very expensive.

Volume and Floor Space

The number of compute modules in a rack is physically limited by their size and electronically by the number of ports available in the top-of-rack switch. The height of the rack is also limited by maintenance and repair access issues.

Even the latest EPA Coral/Summit supercomputer offers only about 0.5 petaflops per rack. With such a large footprint, wire latency becomes significant. If Summit's 240 racks are laid out in a square, the edge length would be approximately 25 meters. With the switches in the middle of the layout, round trip distance is 50 meters resulting in about 250 ns delay.

PREFACE TO DESCRIPTION

Developments in several fields have provided a bricolage of technologies from diverse fields that can improve computer architectures. Yet a lack of vision has prevented them from being applied synergistically to create the virtuous cycle that would greatly improve large computer systems. It appears no one has previously conceived the idea of implementing these many diverse ideas into a higher performance system that never needs repair.

Stubbornly requiring maintenance has been a major impediment. With continuing improvements in reliability, most electronic components rarely fail. Ironically, the requirement for repairability significantly contributes to system downtime and thus higher operational costs and lost opportunity costs. Repairability leads to human caused system disturbances—system jostling and repair errors that lead to downtime. Energy inefficient, air cooled systems are generally preferred over liquid cooled systems as they are easier to repair but they also lead to additional system costs and failures due to fan failures, vibrations and filter maintenance.

High performance direct networks have gained little traction as the cost and complexity of implementing them in rack based systems is generally prohibitive. In the few instances they have been implemented, implementation was of limited bandwidth to reduce cabling to cut costs, thus undermining the purpose of deploying them.

Lastly, these bricolage of technologies are quite diverse. An expert in a few of these fields—computer system capital and operating costs, computer hardware and software constraints, computer energy efficiency, reliability and maintenance, dense liquid cooling, direct networks, fault tolerant multi-path networking and associated algorithms, network switching theory, and integrated circuit design and technologies—is unlikely have significant experience in many others, much less all of them and thus be able to fully conceive such a synergism between them and apply it to a synergistically improved computer architecture.

BRIEF SUMMARY OF THE INVENTION

This invention describes a new physical computer architecture for a high performance, high reliability, ultra-dense system that never needs physical repair during its lifetime. Preexisting technologies are combined and further extended in a virtuous cycle eliminating many material and performance inefficiencies in large computer systems.

We have tapped a bricolage of technologies from diverse fields to develop this architecture. While each technology has been used to some extent in other systems, the unique combination of these technologies and improvements thereto are quite novel.

Targeting computer technical limitations and costs, the new architecture is synthesized using the latest developments in dense liquid cooling, fault tolerant multi-path networking, integrated circuit design and technologies.

The system comprises a plurality of electronic containers herein called "Bricks", assembled to form a three dimensional rectangular "Cube" like structure. Each Brick performs one or more compute, storage and interface functions. Bricks are arrayed in three dimensions, butted together so as to require minimal physical room between or through them for liquid cooling, power and network interconnects. The close physical proximity of Bricks to one another in this rectangular cube shortens the interconnects between distant Bricks permitting the use of reliable, low power and low cost copper electronic interconnects between most, if not all, Bricks.

The Cube incorporates two complementary technologies: conduction liquid cooling and a direct network of high radix switches that comprise a distributed, multi-path, multi-dimensional, very high aggregate bandwidth, mesh network.

Liquid conduction cooling eliminates the space requirement for conventional air cooling. Conduction liquid cooling can be either direct conduction via immersion cooling or conduction to a cold plate. In the latter case as described herein in the exemplary form, cold plates in the form of cold rails through which coolant flows are laced through the Cube structure, thermally contacting and cooling all the high heat generating components.

The physically rectangular Cube structure enables implementation of an efficient three dimensional (3D) mesh routing network that laces orthogonally through the Cube, directly interconnecting these Bricks in a very high aggregate bandwidth, direct network. This mesh topology follows the physical structure of the Cube. In addition to the three real dimensions, it can be implemented with additional virtual dimensions, equally efficiently.

Such a dense structure is extremely difficult to service for maintenance or repair. It would require at least partial disassembly to access interior components. The Cube employs hardware and software embedded in the chips and processors to implement a distributed, dynamically adaptive, multiply-fault-tolerant routing protocol to eliminate the need for physical system repair during its lifetime. Broken interconnects are immediately routed around. The management system identifies failing units that are then logically, but not physically, removed from the system by the management system, and other units are logically inserted as replacements. This is done with efficacy within the network which has a relatively large cross-sectional bandwidth and dynamic multi-path routing. The network management system is distributed. There is no centralized manager that can fail. Each node comprises a piece of a cellular automata system that manages packet routing between nodes in a completely distributed system.

One exception to replacement may be the desire to replace failed disks or optical interfaces to external systems. As noted above, disks are mechanical devices. Their reliability is typically much lower than electronic components. By mounting storage Bricks on the side of the Cube, these disks can be easily replaced. In a typical fault tolerant (e.g. active data backup by data mirroring) storage system, failing disks are disabled and new data backup made transparently to the functional operation of the compute system. The disks can then be replaced at leisure without disturbing system operation. Similarly, optical components used for interface to the system from external systems are less reliable than other electronics and it may be desirable to side mount them and make them replaceable.

With failures quickly and automatically repaired without external intervention, a high availability, fault tolerance system with 99% up time is achievable.

BRIEF DESCRIPTION OF DRAWINGS

FIG. 1 illustrates an open frame compute Brick
FIG. 2 illustrates a compute Brick slice, i.e. a 2D array of compute bricks
FIG. 3 illustrates a Brick slice with cold rails attached
FIG. 4 illustrates Bricks arrayed in a 3D rectangular cube
FIG. 5 shows an interdigitated Brick variation
FIG. 6 is a prior art view of a 3D Hyper-X mesh interconnect
FIG. 7 shows a folded rectangular array using the Bricks of FIG. 1

DEFINITIONS

A number of computing and networking terms are only loosely defined by convention. The following terms are defined for their use herein.

Compute System—a computer or a computer cluster comprising multiple computers
Cold Rail—a cold plate through which a coolant (i.e. cooling fluid) circulates
Dimensions or Degrees—these two terms are often used interchangeably in the definition of the network topology. They define the minimum number of disjoint paths (hops) between the farthest apart nodes. Orthogonal dimensions are analogous to the three physical dimensions of space, but may include a higher number of virtual dimensions.
Direct Network—a network in which each node interfaces to the network via a dedicated multi-port switch. These switches are, in turn, interconnected together to form the network. The interconnections between these switches comprise a mesh with multiple paths between every pair of nodes. The mesh maybe regular or irregular and comprise any number of fractal or orthogonal dimensions. An indirect network wherein multiple nodes are connected to a multi-port (e.g. crossbar) switch is the opposite of a direct network.
Heat Riser—a means to conduct heat from a component requiring cooling to a cold rail, typically comprising a block of aluminum or heat pipe configuration.
High Radix Switch—a switch with a large number of ports.
Hop—the movement of a data packet from one switch to another.
Hyper-X topology—a mesh topology wherein each switch in a direct network connects to every node in one axis in each network dimension.
Multi-Path Dynamic Routing—determining the next hop for a data packet in real time at each switch it traverses.
Network—an interconnection of nodes by switches

DETAILED DESCRIPTION

The exemplary implementation described in the detailed description has the following characteristics:
fail-in-place hardware—inoperative or failed hardware internal to the Cube is normally disabled and left in place rather than repaired or replaced,
no single point of system failure within the Cube,
two phase pumped refrigerant liquid cooling by means of cold rails laced through the Cube,
high voltage DC power distribution with local low voltage power conversion in each Brick,
indefinite scalability independently in each of three dimensions by abutting Bricks without space reserved for air cooling or human access,
a high speed multi-dimensional direct interconnection mesh network that can dynamically reroute around a broken or congested link without significant pause of the system
distributed network management
redundant fault tolerant storage within each Brick for fast system checkpointing It is not necessary for an implementation to ascribe to every feature in the exemplary implementation to be within the bounds of this invention. For example, cold rail cooling can be replaced by immersion cooling.

A Brick comprises any mix of one or more compute, storage and interface nodes, and at least one high radix switch component, all mounted on or in a supporting structure. Bricks are further assembled to form a three dimensional rectangular cube like structure.

A switch component may be instantiated as a stand-alone component or integrated in a module, or within another chip such as a CPU chip.

A compute node contains at least one compute node comprising processor, memory, power converter and switch component.

A storage node comprises at least a processor, non-volatile storage, either as rotating media or solid state, a power converter, and a switch component.

An interface node comprises similar components as a compute Brick but with the addition of an external network interface.

For the exemplary instantiation, Bricks are mounted on a mechanical base that provides support for the entire structure. Each Brick is a mechanically an open frame structure supporting one or more printed circuit motherboards, but may comprise a tray or other supporting structure. For the exemplary case, each Brick mechanically mates with adjacent Bricks via interlocking features on the Bricks. This creates a strong yet easy to assemble self-supporting structure. One skilled in the art may conceive of many such configurations of interlocking features. All such configurations are included under this invention.

Bricks can be of any size or dimension. For the exemplary implementation each Brick is 24" wide by 24" deep by 2" thick and has two nodes. Bricks are laid on the narrow edge in this implementation, with multiple such Bricks abutted on edge comprising a slice of the Cube. A slice can comprise any arbitrary number of Bricks. A Cube can comprise any number of such slices abutted together. For a ten foot high Cube, areal density for dual processor server nodes is about 30 nodes per square foot of floor space, about six times denser than traditional rack based computer clusters.

All Bricks need not be identical in size. For example, it may be desirable to mount many disks into a larger Brick. The only requirement is physical compatibility with the Cube structure and electrical compatibility with the network connections.

It may be desirable to have some Bricks replaceable for repair or upgrade. Integrating the storage components into the compute network can dramatically improve storage access and checkpoint performance. But storage disks are generally less reliable than other components and it may be preferable to make them replaceable rather than integrate many spares when the system is commissioned. Storage Bricks may be mounted on the side of the Cube where defective disks can readily be replaced if so desired. Similarly, interface Bricks that interface to the outside world may have less than very reliable optic interfaces. As these interfaces limit communication with the outside world, mounting them on the Cube side where they can be replaced may be advantageous.

Bricks can be interdigitated with their neighbors. As an example, a 24" wide Brick could be arranged to overlap the corners of four adjacent Bricks on either side by 12". In such a case, cutouts on each motherboard could be made that line up with the interdigitated boards to allow power and cable pass-thrus. Interdigitating boards typically permits direct connection through electrical connectors between one board and 12 neighbors (four each above and below, and four adjacent). This reduces the amount of cabling required for interconnection. Note that in such a case, the Cube slices discussed above are also offset and therefore may not be identical.

Bricks have heat risers thermally attached to the hotter components that require direct cooling, i.e. those that dissipate more than a pre-defined amount of power, typically one or two watts. Heat risers are highly thermally conductive, typically comprising an aluminum block or heat pipe configuration. A heat riser conducts the heat from a component that requires cooling to a common plane wherein it is thermally connected to a cold rail with a circulating cooling fluid within that removes the heat from the riser and thence to the outside of the Cube. Typically, a thermal grease or other thermal interface material (TIM) is inserted between the cold rail and riser. For best thermal efficiency, the cold rail can be clamped to the riser with a minimal thickness of thermal grease. The balance of the motherboard components are cooled either directly by convection of ambient air (that air is in turn cooled by its proximity to the cold rail), or indirectly by thermal connection from the cold rail to a conduction cooled neighbor component on the motherboard, or conduction cooling of the motherboard locale by thermal attachment of that board locale to the cold rail.

Each Brick has one or more routing nodes each comprising a switch chip (or area on another (e.g. processor) chip) with typically about 50 to 100 high speed bidirectional data ports brought out to at least one connector. Connectors are attached to one or more cables capable of carrying very high speed signals. Neighboring boards can be directly connected via abutting connectors rather than cables.

Such cables connect to other Bricks, comprising a mesh. In this exemplary instantiation, each data port is connected to a corresponding data port on another Brick, resulting in each Brick being directly connected to approximately 50 to 100 other Bricks. Data packets may traverse one or more Bricks on their way to their final destination. One method of interconnection has each Brick fully connected along each axis to every other Brick on that axis (Hyper-X topology). Other configurations such as fully connecting all Bricks on a slice, or chordal ring or tori configurations may be used. Each configuration has cost benefit tradeoffs such as reducing the interconnect requirements and thus cost, typically at a performance cost of one or more additional data hops.

Each node has at least one out-of-band port (i.e. not part of the mesh network) that can be connected to one or more neighbor nodes. In the event that this first node does not respond to signals sent in-band through its mesh network ports, the neighboring nodes can cause the first node to selectively reset the processor or disable the power feed. Mounting two independent nodes having independent power and cooling in the same Brick, permits each node to be the manager and state mirror of its neighbor node. Additional other Bricks could provide backup management and voting systems to assure proper operation and disabling mechanisms.

Each Brick has one or more power connectors though which it connects to a power distribution network internal to the cube. Each connector feeds at least one power bus converter that regulates and reduces voltage as required, providing power to the Brick components at the required voltage. The bus converter contains a mechanism whereby power can be completely removed from the Brick or its subcomponents. In this instantiation, the distributed power is 380 VDC that is stepped down to 12 VDC by the bus converter. High voltage distribution eliminates large bus bars and increases power efficiency.

In the exemplary example, power is routed though the base by vertical buses. However, power can be routed from the top or sides of the Cube.

The cold rails are physically and thermally attached to the Bricks and its components. The direct thermal path between chips and rails enables heat to be dissipated from the Cube to an external heat sink with relatively low thermal drop.

In this instantiation, multiple thin aluminum micro-channel cold rails about 0.1" thick are strung through the Cube, and connected to at least one Coolant Distribution Unit (CDU). Two phase coolant such as R134a is pumped through these cold rails. The Bricks are secured to and thermally attached to the cold rails so that the Bricks' heat risers are in good thermal contact with said cold rail. Heat is conducted from the hot components through the heat risers and into the coolant which then absorbs the heat through phase change. The resultant mix of hot gas and liquid is condensed and re-cooled in the CDU.

Optionally, other designs of cold rail and cooling fluids may be used, such as a water/glycol mix circulating through stainless steel cold rails, or immersion cooling.

The high radix router chips support all data traffic internal to the mesh. Each is attached to a host processor in the Brick via a high bandwidth interface and is controlled by that host processor.

Networking

The high radix switch performs or supports the following functions:

- Receives data packets from the host, encapsulates them into one or more packets with address and data integrity information, and forwards these packets though one or more output ports.
- Receives packets from its neighbors, checks them for integrity and either re-forwards them through another port; or receives them, strips off the encapsulation, combines and reorders them as required, and forwards them to the host by DMA or other means.
- Multicast—optionally forwarding a single packet to multiple destinations simultaneously through multiple ports.

This Cube natively supports interconnect in a three dimensional array structure. The interconnection network is hard wired and not designed to be field repairable. Each node directly connects to multiple other nodes over copper interconnect. A Hyper-X topology enables communication with tens of thousands of other nodes with a maximum hop distance of only 3. An equivalent fat tree network would require 7 hops. In addition, the average hop distance is also close to 3 so system jitter is minimized. Larger systems or alternative mesh configurations or smaller radix switches may result in a system with more than 3 hops.

Current state-of-the-art integrated circuit data output performance ranges up to 50 Gb/s. High speed switching systems often concatenate multiple chip outputs into higher speed links (e.g. 100 Gb/s or 200 Gb/s). Although concatenated links can be used herein, the exemplary system does not concatenate but uses the chip outputs at their native speed, i.e. one link per output. Concatenating links reduces the number of links available from a set number of chip outputs, requiring more hops through intermediate chips in large systems. Thus, even though each link has a lower bandwidth than a concatenated link, small messages are transmitted much faster as there a fewer hops. For large messages, the switch will disperse and route multiple packets over many output ports allowing transfer rates exceeding that of conventional optical links. Buffering and reordering circuitry at the destination rearranges packets received out of order into the original message order. Dispersal methods such as random port forwarding and real time automatic rerouting of packets is employed to avoid broken or congested links and nodes.

Using this scheme the cross sectional bandwidth of a 32,968 node system with 50 Gb/s links would be about 13 Pb/s in contrast, a fat tree connected with 200 Gb/s would have only 3.3 Pb/s Copper connectivity is enabled by a thin ribbon cabling system that can maintain signal strength and integrity over 5 meters. This reduces costs. However, nothing in this invention eliminates the use of optical interconnects if desired.

The network comprises a direct network with a non-blocking switch at each routing node. Based on a central memory architecture, each routing node comprises a piece of a cellular automata system that manages packet routing between nodes in a completely distributed system. Route determination is done in real time by these individual switches, eliminating any single point of failure.

Central memories are ideal switches as they need neither input nor output buffers, thus are non-blocking. With the emergence of high levels of integration and advanced logic design techniques, a central memory switch of virtually any size can be built using constructs such as "Gatling Gun" memories.

Storage Bricks

A mass storage Brick would contain either rotating or solid state storage. It could also serve as part of a burst buffer scheme for system checkpointing. It is expected that these would be at the surface of the Cube to ease disk replacement if it proved necessary.

Exemplary Instantiation Description

FIG. 1 is a greatly simplified illustration of an exemplary instantiation of a Brick 20. It is 24 inches on a side and 2 inches thick. The actual dimensions of a Brick can vary substantially for different instantiations. This Brick 20 comprises two motherboard based processing nodes 3, 4 mounted on a supporting frame 1. This frame can be a simple open support structure, tray or closed module. To illustrate there is no restriction upon mixing and matching different node types, these two nodes 3, 4 comprise two differently configured processing units 7, 6 such as a main CPU chip and a GPU co-processor. In another instantiation, these two nodes might be combined unto a single printed circuit board 50 (FIG. 5). For simplicity, the many other components mounted on these boards are not shown. Also, of the typical multiplicity of integrated circuits (ICs) mounted upon these motherboards, only several of these ICs 6, 7, 9 are illustrated. Heat risers 5, 8, 10 respectively are mounted on these ICs. These heat risers conduct heat to an essentially common plane for further thermal conduction to cold rails. High voltage power bus bars 2, 14 are vertically aligned on either side and connected to the boards by connectors (not shown). The high voltage from these bus bars is converted to lower operating voltages by board mounted converter units (not shown). Network cables 13 run orthogonally in the "Z" dimension with selected connections made to one or more connectors 12 on each board. Only a small fraction of the possible number of cables and connectors are shown. Connector(s) 11 are also used to interface to network cables (not shown) running orthogonally in the "X" and "Y" dimensions.

FIG. 2 illustrates a simplified 3 by 3 array 40 of multiple Bricks 20 comprising a slice of a small compute cube. Bricks interlock to form a strong stable structure. There are many ways to design such an interlocking structure to one skilled in the art so no further details are shown. Power buses 2, 14 also interlock so as to form a continuous vertical power bus. Although only a few bricks are shown, rectangular cube arrays can comprise many thousands of Bricks.

FIG. 3 is a cropped dimeric view of the corner of the Compute Brick Slice 40 shown in FIG. 2 with cold rails 30, 31 attached. These cold rails are about 4 inches high by 0.10 inches thick. They extend across the entire array. Liquid refrigerant is pumped in one end. As the liquid traverses the array it absorbs heat from the Bricks. The liquid partially evaporates such that at the end of the cold rail the refrigerant emerges as a mixture of liquid and gas. The exiting refrigerant is at the approximately same temperature as the incoming refrigerant, providing isothermal cooling to the Bricks. Heat is directly conducted to the cold rails from the thermal attachment of the heat risers, and indirectly through convection from other sources of heat within each Brick. The cold rails are terminated in manifolds (not shown) that conduct the liquid to and from a heat exchanger.

In place of cold rails, immersion cooling in a mineral oil or room temperature refrigerant may be used as the cooling technology. As anyone skilled in the art can design and configure such cooling systems, no further details are shown.

The horizontal and vertical ("x" and "y") network cables (not shown) are laced over the cold rails. Spaces 32, 33 provide room for local cabling and connector attachment.

FIG. 4 illustrates an array of 8 of the Compute Brick Slices 40 (40-1 . . . 40-8) shown in FIG. 3 in a complete configuration as a rectangular array. Note that each edge of the rectangular array may be different length.

FIG. 5 is a dimetric view of an interdigitated array. Each slice is offset in both the "x" and "y" dimensions by one-half the width/length of a Brick. Boards 3, 4 (FIG. 1) are combined into a single motherboard 50. Combined motherboard 50 permits interconnections between the two previously separated motherboards 3, 4 within the motherboard 50, eliminating cable connections between them, and further enabling other interconnections between nodes. For example, interdigitating permits each Brick to directly interface in the "z" dimension to eight other motherboards 50 (four in front of and four behind) through connectors 52 rather than cables. This reduces cabling complexity and cost. Connectors 53 are used to connect adjacent Bricks in the "x" and "y" dimensions.

Cutouts are made in motherboard 50 to permit cables 51 to traverse the rectangular cube in the "z" dimension.

An interdigitated array leaves gaps one-half Brick high/wide on the ends of the cube. These might be employed to mount removable half width Brick such as input-output Bricks that incorporate less reliable components such as lasers.

FIG. 6 is prior art illustrating a partial schematic interconnection drawing of a four by four by four (4×4×4) rectangular array. The 64 nodes are connected in a regular square array from x0/y0/z0 t0 x3/y3/z3. Node X0/Y0/Z0 60 is fully connected to all nodes in the "x" direction from X0 to X3 by the interconnection group 64, to all node in the "Y" direction Y0 to Y3 by the interconnection group 62, and all nodes in the "z" direction Z0 to Z3 by the interconnection groups 63. Likewise but not shown, all other nodes are similarly interconnected. Such a configuration, all nodes fully connected along each axis is sometimes called a Hyper-X topology.

If the Bricks of the exemplary instantiation were spatially laid out along the lines of the FIG. 6 schematic, the cube this size would be about 8 feet wide by 4 feet tall by 8 inches thick. Note the cube is only 4 feet tall as the a Brick comprises two nodes. Such a physical size would not be optimum for most applications. It would be an odd size to fit into a data center. And wire lengths would vary widely making the 8 foot "x" dimension wiring performance more critical than the other two dimensions.

In such a case, the system could be folded as shown in a physical schematic representation in FIG. 7. For clarity, interconnection lines have been removed and only select nodes are labeled. Node X2/Y0/Z0 68 physically resides behind and adjacent to node X0/Y0/Z0 60 instead of to its right side in FIG. 6. Other nodes are similarly placed. Note that as the nodes are fully connected in a dimension, the x location nomenclature is somewhat arbitrary, e.g. the X2 and X1 nodes can be swapped without any effect on the system. With this physical configuration, the nominal system size is 4 feet wide by 4 feet high by 16 inched deep, a much better configuration for both data center floor space and interconnectivity requirements. A further benefit of this configuration is the folded nodes can be directly interconnected by connectors between the front and rear folded nodes, reducing cabling requirements.

The number of interconnections in each dimension need not be the same. For example, instead of an array from X0/Y0/Z0 to X3/Y3/Z3, this same array could go from X0/Y0/Z0 to X1/Y3/Z7–2 interconnects in dimension "x", 4 interconnects in dimension "y" and 8 interconnects in dimension 'z'. This however is less interconnect efficient as each node now connects to 11 other node versus the previous 9 nodes, increasing the total number of interconnects proportionately. This same system could also be connected in only two dimensions instead of three. As an example, all the nodes in the "x" and "y" physical plane of the X1/Y3/Z7 configuration above could be fully interconnected, eliminating the 'y" dimension. It would then be schematically connected from X0/Z0 to X7/Z7. This configuration requires more interconnect, but it reduces the system diameter from 3 hops to 2 hops, significantly improving performance.

Alternatively, a fourth virtual dimension could be added. Referring to FIG. 7 again, the system would be from W0/X0/Y0/Z0 modified node 60, to W1/X1/Y3/Z7 modified node 61. While this would make little sense in a small system such as in FIG. 7, it could be very useful in building very large systems of many thousands of nodes. A regular 3D array of 32 nodes on a side would comprise 32,768 nodes and require a 93 port switch. For a regular 4D array comprising a fourth virtual dimension 24 nodes on a side would comprise an Exascale system of 331,776 nodes and require a 92 port switch.

An alternative means to achieve a larger system is a sparser interconnect scheme. Nodes in any or all of the dimensions could be skipped, albeit with a loss of performance. For example, by skipping every other node in a dimension instead of connecting to every one, the system size could double without using a larger switch, or the interconnect costs halved if cost is more important than performance. Chordal ring configurations could similarly be used. Such fractal interconnection topologies are well known and could be applied by one skilled in the art so they are not further explained herein.

Myriad tradeoffs in physical configuration, performance, interconnect costs, and switch size are therefore readily possible to achieve in such a system.

Detailed Description of Networking Switch Algorithms

Each routing node comprises a central memory based high radix switch. The central memory is used to buffer and store data packets on their journey through the node from input to output. The central memory is a random access memory. Data packets can be randomly stored and retrieved and are therefore available to be forwarded upon selection without queuing behind other packets. Such a selection and forwarding system is inherently deadlock free as there are no cyclical dependencies.

Protection against livelock is assured by: providing virtual feedback paths independent of normal data packet traffic that provide for backpressure and system handshakes; aging and killing packets that exceed a predefined age; and heartbeats to restart activity should the system otherwise stop operating.

Routing node circuitry receives data packets from multiple input ports and delivers them internally to their various output ports via interaction with a central memory as a buffer and storage means. Commonly, each pair of input and output ports is combined into a bidirectional port attached to the same external device. This permits bidirectional management communication between routing nodes. A sliding window protocol with resend capability and optional forward error correction (FEC) can be used to assure error free transmission between routing nodes. The virtual feedback path described above is an extension of the link level protocol between routing nodes. End point receiving nodes can send ACK and NACK commands over this link level protocol back to the source nodes to manage congestion or other management activities. Packets sent over link level are switched, not routed and therefore not guaranteed to be received by the end nodes as there are no acknowledgements of such packets. This connectionless UDP style protocol prevents cyclical dependencies and a possible livelock situation.

When a data packet arrives at an input port, the routing node circuitry examines the header and determines the optimum ports to forward the packet towards its final destination. If there is network congestion or the selected ports are not available, the data packet may be forwarded via a random non-optimum port. If the receiving node is the data packet's final destination, circuitry delivers it to a reassembly buffer where data packets are reordered and stored if necessary before being delivered to the Brick central processing unit (CPU).

The forwarding algorithm is port centric. Each output port is selected in turn. If the selected port is unconstrained to accept and forward packets (not busy, disconnected or broken) an arbiter will select a packet to forward through it. All valid data packets that need forwarding to another node that are currently being received or in memory are examined by the arbiter to determine the optimum data packet to forward through that port. The selected packet is then forwarded while the arbiter moves on to the next port in turn. Multiple coordinated arbiters may be employed for higher performance.

A packet is selected to be transmitted through an output port by a predetermined weighting comprising among other factors:
- whether the output port is on the only shortest interconnection path to the packet's destination,
- whether the output port is on one of the a shortest of multiple paths to the packet's destination,
- the length of time the packet has been in the network,
- the length of time said packet has been in the routing node,
- if no packet meets the criteria for a shortest path, a packet may be chosen for random forwarding from the central memory if it: a) exceeds a predetermined time in the central memory, or b) is set to be dispersed from its originating switch.

The entire network acts as a cellular automata system. Data packet forwarding decisions are locally made with incomplete system knowledge. Data packets are forwarded from each routing node in a non-globally-predetermined manner though the node's output ports. That is, the packets are not restricted to predefined paths through the network—packets between two nodes may traverse different paths unconstrained by a central manager.

We claim:

1. A computer system comprising:
   a multiplicity of compute Bricks, each comprising any mix of one or more compute, storage and interface nodes;
   said multiplicity of compute Bricks assembled into a three dimensional rectangular cube like structure, said rectangular cube like structure indefinitely and independently scalable in each of three physical dimensions by abutting said compute Bricks together without interior space for air cooling or access for repair or replacement, said rectangular cube like structure comprising abutting said compute Bricks and non-abutting said compute Bricks;
   a means to cool said multiplicity of compute Bricks by conduction to a multiplicity of cold rails having a cooling fluid flowing therethrough;
   at least one of said multiplicity of cold rails coupled to several of said compute Bricks and substantially traversing the extents of said rectangular cube like structure in one of said three physical dimensions of said rectangular cube like structure;
   a multiplicity of signal wires, each interconnecting a predefined pair of said non-abutting compute Bricks, said multiplicity of signal wires traversing the interiors of said compute Bricks intermediate to each said pair of said non-abutting compute Bricks.

2. The computer system of claim 1 wherein a plurality of pairs of said abutting said compute Bricks incorporate connectors, said connectors mated by abutment of said abutting said compute Bricks in at least two dimensions.

3. The computer system of claim 1 wherein said multiplicity of compute Bricks are interdigitated in at least one dimension such that each of a plurality of said abutting said compute Bricks is electrically interconnected via said connectors to two said abutting said Bricks on either side of said each of a plurality of said abutting said compute Bricks.

4. The computer system of claim 1 wherein a high radix switching component is resident in a plurality of said multiplicity of compute Bricks, a plurality of said high radix switching components interconnected as a packet switching direct interconnection network, said packet switching direct interconnection network further comprising the following features:
   distributed network management system resident in a plurality of said nodes,
   a plurality of independent interconnection paths between any two said nodes,
   a multi-path packet routing method with a reordering function at the destination node,
   cellular automata based routing algorithm capable of dynamic real time automatic rerouting of packets around a broken or congested link without central management involvement.

5. The packet switching direct interconnection network of claim 4 wherein said packet switching direct interconnection network is partitioned into a multiplicity of orthogonal dimensions, each dimension fully interconnected thereby creating a HyperX interconnection network.

6. The HyperX interconnection network of claim 5 wherein said HyperX interconnection network is physically folded back into itself.

7. The packet switching direct interconnection network of claim 4 wherein said packet switching direct interconnection network is a deadlock and livelock free fault tolerant interconnection packet switching network, wherein:
   each of said multiplicity of switching components receives a multiplicity of data packets through a plurality of input ports and forwards said multiplicity of data packets non-predeterministically though a plurality of output ports,
   each of said multiplicity of switching components further comprises; a central memory for temporarily storing said multiplicity of data packets received from said plurality of input ports; a forwarding means that receives said multiplicity of data packets from said plurality of input ports, forwards said multiplicity of data packets to said central memory and thence to said plurality of output ports; and a selection means that selects each of said plurality of output ports in turn and determines which one of said multiplicity of data packets stored in said central memory shall be forwarded by said forwarding means to said selected one of said plurality of output ports; said component having the following additional features;

said one of said multiplicity of data packets stored in said central memory is selected and forwarded to said one of said plurality of output ports only if said one of said plurality of output ports is determined to be unconstrained to accept and forward said packet by said forwarding means;

said selected and forwarded one of said multiplicity of data packets stored in said central memory is selected by comparison to all other said multiplicity of data packets stored in said central memory based upon a predetermined weighting comprising:

whether said one of said output ports is on the only shortest interconnection path in said network to said packet's destination, else, whether said one of said output ports is on one of a multiplicity of shortest interconnection paths in said network to said packet's destination, and, the length of time said packet has been in said network, then, the length of time said packet has been in said central memory, if no packet meets the criteria for a shortest path, a random packet is chosen from said central memory if it exceeds a predetermined time in said central memory or is in the originating switch, and the packet with the longest amount of time in said central memory a reassembly means to reorder said multiplicity of data packets after transmission across the network into the order in which said multiplicity of packets was transmitted.

8. A method for making a very large compute system with a reduced need for optical based signal cabling comprising:

encase a compute means and high radix switch in a container, said container conducive to being tightly stacked with other said containers by abutment in three dimensions, said container having passages reserved for electrical cabling and cooling rails, but with no space within said container for air cooling, connect said high radix switch to a multiplicity of electrical connectors, a first set of said multiplicity of electrical connectors mounted on at least four sides of said container aligned to mate with adjacent other said first sets of said multiplicity of electrical connectors on other said containers when said container and said other containers are abutted, and a second set of said multiplicity of electrical connectors not so aligned.

stack a plurality of said containers by abutment in a three dimensional rectangular array with no physical space within said three dimensional rectangular array reserved for air cooling or maintenance, wherein said first set of said multiplicity of electrical connectors and said adjacent other said first sets of said multiplicity of electrical connectors are mated, several of said plurality of said containers mounted interior to said three dimensional rectangular array such that said several of said plurality of said containers has no side nor edge in common with an outside edge or side of said three dimensional rectangular array;

install a plurality of cooling rails interior to said plurality of said containers along the extents of one axis, each of said plurality of cooling rails traversing several of said passages reserved for cooling rails within said plurality of said containers thereby cooling said plurality of containers by conduction to a cooling fluid flowing through said plurality of cooling rails;

lace electrical signal cables through said containers in all three dimensions, using said electrical cables to interconnect predetermined pairs of said second set of multiplicity of electrical connectors on non-abutting containers;

wherein the lengths of said electrical signal cables are sufficiently short to accommodate the use of copper signal cables.

9. The method for making a very large compute system of claim 8 wherein a HyperX network comprising said electrical signal cables is physically folded back on itself to equalize the dimensions of said rectangular cube whereby the length of said electrical cables is reduced.

10. A method to interconnect a compute system with a direct network, such method comprising:

encase a compute means attached to a high radix switch in a container, said container having passages for interconnection cabling, said high radix switch connected to a plurality of connectors, several of which are mounted proximate to sides of said container;

stack a plurality of said containers by abutment in a three dimensional rectangular array with no physical space between said plurality of said containers reserved for interconnection cables, said three dimensional array scalable to an indefinitely large size in all three dimensions;

interconnect a plurality of said high radix switches in said three dimensional rectangular array by interconnecting selected pairs of said plurality of said connectors by 1) mating a plurality of said several connectors mounted proximate to said sides of said containers to abutting several connectors mounted proximate to said sides of other said containers and 2) lacing a plurality of interconnection cables through said passages for interconnection cabling of said plurality of said containers, said plurality of interconnection cables passing through said containers intermediate to said selected pairs without making a connection to said containers intermediate to said selected pairs;

wherein said compute means are interconnected in a direct network.

* * * * *